US009325337B1

(12) United States Patent
Dempsey

(10) Patent No.: US 9,325,337 B1
(45) Date of Patent: Apr. 26, 2016

(54) SELF-REFERENCED DIGITAL TO ANALOG CONVERTER

(71) Applicant: ANALOG DEVICES GLOBAL, Hamilton (BM)

(72) Inventor: Dennis A. Dempsey, Newport (IE)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/593,591

(22) Filed: Jan. 9, 2015

(51) Int. Cl.
*H03M 1/10* (2006.01)
*H03M 1/66* (2006.01)

(52) U.S. Cl.
CPC .............. *H03M 1/1033* (2013.01); *H03M 1/66* (2013.01)

(58) Field of Classification Search
CPC ....... H03M 1/66; H03M 1/1033; H03M 3/02; H03M 3/372; H03M 3/40; H03M 3/416; H03M 3/456; H03M 3/462; H03M 3/494; H03M 3/504
USPC .......................... 341/145, 136, 120, 119, 118
See application file for complete search history.

(56) References Cited

U.S. PATENT DOCUMENTS

| | | | |
|---|---|---|---|
| 5,087,914 A | 2/1992 | Sooch et al. | |
| 5,764,174 A * | 6/1998 | Dempsey | H03M 1/0602 341/136 |
| 5,969,657 A * | 10/1999 | Dempsey | H03M 1/682 341/145 |
| 6,191,715 B1 | 2/2001 | Fowers | |
| 6,320,528 B1 | 11/2001 | Michel | |
| 6,337,646 B1 | 1/2002 | Hatani et al. | |
| 6,667,703 B1 | 12/2003 | Reuveni et al. | |
| 6,876,697 B2 * | 4/2005 | Peters | H04B 1/0475 375/222 |
| 7,068,193 B2 | 6/2006 | Dempsey et al. | |
| 7,271,751 B2 | 9/2007 | Peterson et al. | |
| 7,355,536 B2 | 4/2008 | Dempsey et al. | |
| 7,355,537 B2 | 4/2008 | Lin | |
| 7,756,663 B2 | 7/2010 | Han et al. | |
| 7,773,011 B2 | 8/2010 | Sahu et al. | |

(Continued)

FOREIGN PATENT DOCUMENTS

CA        1280162 C        2/1991

OTHER PUBLICATIONS

Jiun-Lang Huang et al., *A Bist Scheme for On-Chip ADC and DAC Testing*, Electrical and Computer Engineering, University of California, Santa Barbara, Date 2000, Paris, France, © ACM 2000 1-58113-244-1/00/03, 5 pages.

(Continued)

*Primary Examiner* — Jean B Jeanglaude
(74) *Attorney, Agent, or Firm* — Patent Capital Group

(57) ABSTRACT

In contrast to some existing techniques, a calibration technique compares multiple outputs which may be, for example, successive or different outputs from the digital-to-analog converter (DAC) in an analog environment and determines differences between at least two outputs in an analog environment. A feedback signal is provided in the digital environment to provide an internal or self-calibration regime. The digital feedback signal is provided to a digital signal processing (DSP) component of the calibration circuitry which uses the feedback signal to determine appropriate input codes to provide to the DAC. The same DAC can be used for both signal generation and feedback DAC purposes, and this provides a self-calibration of the DAC performance which is typically related to the integral non-linearity (INL) characteristics of the DAC transfer function.

20 Claims, 4 Drawing Sheets

(56) References Cited

U.S. PATENT DOCUMENTS

| | | |
|---|---|---|
| 7,868,794 B2 | 1/2011 | Datta et al. |
| 8,223,048 B2 | 7/2012 | Wilhite |
| 8,779,953 B1 | 7/2014 | Portmann et al. |
| 2008/0175132 A1* | 7/2008 | Chou .................. G11B 7/005 369/124.1 |
| 2010/0271406 A1 | 10/2010 | Tazuke |
| 2011/0181312 A1 | 7/2011 | Ouslis et al. |

OTHER PUBLICATIONS

Wei Jiang et al., *Built-in Self-Calibration of On-Chip DAC and ADC*, International Test Conference, 1-4244-4203-0/08 © 2008 IEEE, 10 pages.

* cited by examiner

SELF-REFERENCED DIGITAL TO ANALOG CONVERTER

TECHNICAL FIELD OF THE DISCLOSURE

The disclosure relates to the field of integrated circuits, in particular to a digital to analog converter (DAC) which is self-referenced or self-calibrated.

BACKGROUND

Real-world analog signals such as temperature, pressure, sound, or images are routinely converted to a digital representation that can be easily processed in modern digital systems. In many systems, this digital information must be converted back to an analog form to perform some real-world function. The circuits that perform this step are digital-to-analog converters (DACs), and their outputs are used to drive a variety of devices. Loudspeakers, video displays, motors, mechanical servos, radio frequency (RF) transmitters, and temperature controls are just a few diverse examples. DACs are often incorporated into digital systems in which real-world signals are digitized by analog-to-digital converters (ADCs), processed, and then converted back to analog form by DACs. In these systems, the performance of the DACs can be influenced by the capabilities and requirements of the other components in the system. It will be appreciated that in the context of DACs, there are high precision requirements in the presence of stochastic, or random, and deterministic non-idealities and these and other factors are a key motivator for precision tuning and/or calibration in digital to analog converters.

A DAC produces a quantized (discrete step) analog output in response to a binary digital input code and the analog output is commonly a voltage or a current. To generate the output, a reference quantity (usually the aforementioned voltage or current) is divided into binary and/or linear fractions. Then the digital input drives switches that combine an appropriate number of these fractions to produce the output. The number and size of the fractions reflect the number of possible digital input codes, which is a function of converter resolution or the number of bits (N) in the input code. For N bits, there are $2^N$ possible codes. The analog output of the DAC output is the digital fraction represented as the ratio of the digital input code divided by $2^N$ (or $2^N-1$ depending on the specific definition used) times the analog reference value.

To ensure DAC performance matches expectations, the DAC can be calibrated to ensure that the output analog values correspond with the input digital code. Conventionally this calibration is achieved using full system type calibrations but this can require complex external circuitry.

Overview

A unique DAC architecture comprises calibration components in the form of a Built-In-Self-Test (BIST) and calibration system which can provide an intrinsic or 'zero' reference factor. The reference factor can be used to self-reference DAC linearity measurements, thus providing self-calibration. The BIST and calibration system are configured to use actual outputs from the DAC to self-calibrate the DAC. In this way, there is no need for external referencing components to be used in a calibration of the DAC transfer function.

The first and second outputs from the DAC are compared in the analog environment and this comparison is then used as a feedback to a digital signal processor (DSP) component of the DAC architecture. The DSP comprises digital signal processing circuitry which is configured to provide the DAC input codes and compare in a digital environment feedback signals resultant from those codes as part of a calibration routine. A DSP functional block can comprise circuit elements that are configured to provide a mathematical manipulation of a digital signal to modify or improve it. A DSP may also include timing or other control circuit elements, e.g. for testing purposes.

The first and second outputs can be time delimited, i.e., an output at a first time T1 and a second output at a second time T2. In another configuration first and second differential outputs from the DAC taken at the same time can be integrated and their difference checked. In either way, DAC linearity is functionally tested and/or calibrated with only one comparator. By using a digital driven architecture, it is possible to minimize floating-point to fixed-point conversion (FFC) processes and improve precision via digital calibration.

BRIEF DESCRIPTION OF THE DRAWINGS

To provide a more complete understanding of the disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Understanding Non-Linearity in Digital-to-Analog Converters

DACs generally have an integral non-linearity (INL) sensitivity, and this non-linearity or 'relative accuracy' is a key DAC precision specification. Typically, a calibration of the DAC can implement a full system style calibration using externally connected digital voltmeters or the like. Such techniques are based on calibration of the DAC in the digital environment.

A Different Calibration Technique

In contrast to some existing techniques, a calibration technique described herein compares multiple outputs which may be, for example, successive or different outputs from the DAC in an analog environment and determines differences between at least two outputs in an analog environment. A feedback signal is provided in the digital environment to provide an internal or self-calibration regime. The digital feedback signal is provided to a DSP component of the calibration circuitry which uses the feedback signal to determine appropriate input codes to provide to the DAC.

The same DAC can be used for both signal generation and feedback DAC purposes, and this provides a self-calibration of the DAC performance which is typically related to the INL characteristics of the DAC transfer function.

The DSP can be configured to provide an analysis of the DAC performance, for example non-linearities, based on a plurality of data points that are based on digital feedback signals received from the comparator. In aspects of such a configuration, the DSP is configured to compare the data points based on the received digital feedback signals against a predetermined range of expected response characteristics. This predetermined range of expected response characteristics is resultant from analysis of the expected DAC performance. For example, parts or circuit elements may be characterized prior to test to identify what would be the expected performance characteristics. Deviations from this expected performance characteristics identify potential flaws or errors in the actual DAC.

This comparison provides a built in self-test (BIST) functionality within the architecture where the circuit components themselves provide an analysis of the DAC performance and can identify abnormalities or flaws in the DAC response characteristics from what would be expected from such a DAC. When this is done on-chip, the predetermined range of expected response characteristics are stored and accessible to the DSP as part of the calibration routine. This storage could be on volatile or non-volatile memory that is coupled to the DSP. In other configurations the range of values could be hardcoded, for example based on the pre-characterization of the parts.

Exemplary Block Architecture

Figure 1:
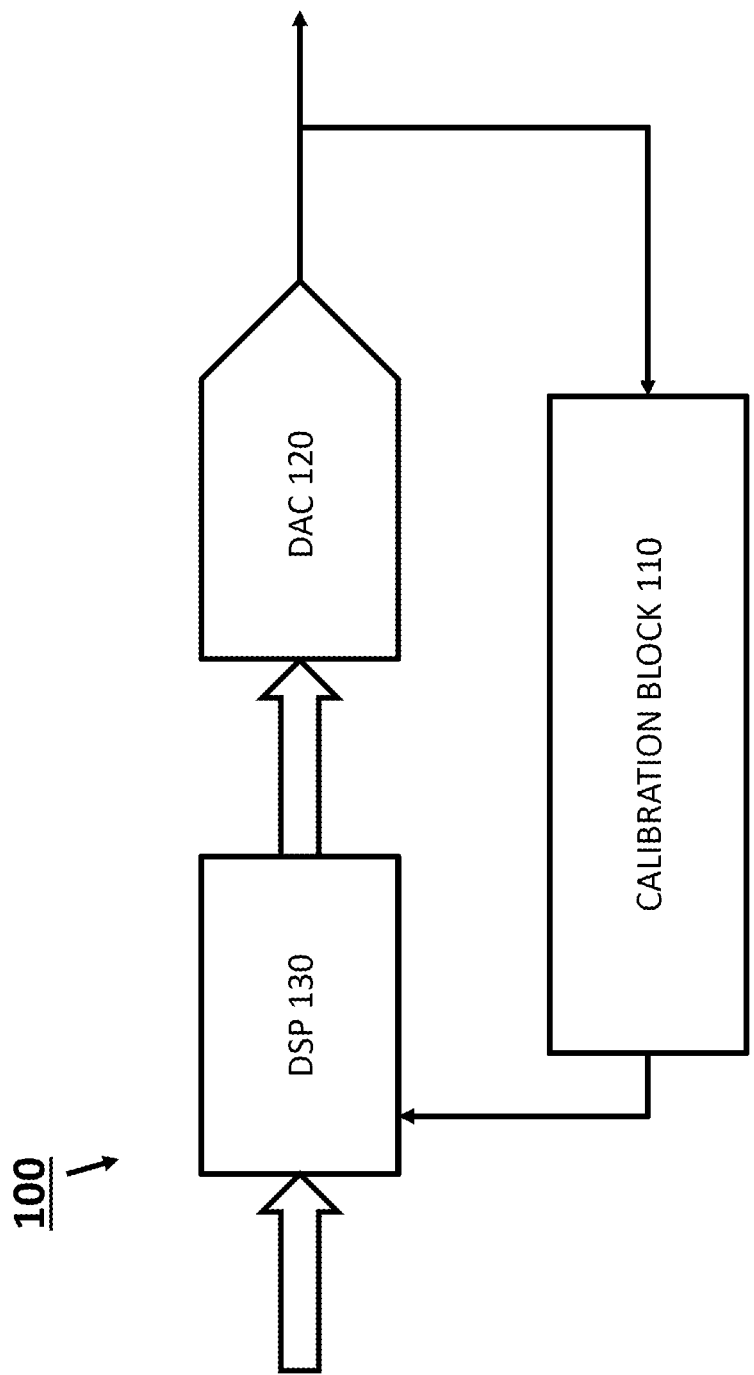
FIG. 1 is a schematic of block architecture implementing a DAC system, according to some embodiments of the disclosure.

FIG. 1 shows an exemplary block architecture 100, according to some embodiments of the disclosure. In this architecture, a calibration block 110 is incorporated into a feedback path between a DAC 120 and the driver DSP component, DSP 130. The calibration block includes functionality that can integrate multiple DAC outputs and check their differences to digitally calibrate target operating points of the DAC or the DAC transfer function.

Examples of such target points include which DAC input code best corresponds to mid-scale performance of the DAC. To initialize the calibration, ideal values such as those that provide 2* mid-scale being greater than full scale can be initially chosen. If the output does not correspond to this desired operating range, then the DAC input code originating from the DSP 130 can be increased and the process can run again. The step sizes that are tested can be varied. A variety of different approaches such as use of a binary search process, sub radix-2 or single code step increments can be considered.

Over-sampling can also be used to extend the resolution and precision of this calibration. Such oversampling may be provided by use of a 1-bit sigma delta analog to digital converter (sigma delta ADC). The architecture can be linearly interpolated (PWL) calibrated between points or more complex systems may be used. As a result it is possible to provide a low analog mixed signal (AMS) sensitivity, digital-focused architecture suited to process shrinkage and migration reducing total manufacturing cost and improving precision via digital calibration and thereby improving performance.

By specifically integrating or summing the output of the core DAC functional block in the analog environment using calibration block 110 and using the result of that mathematical function as a feedback control to the DSP 130 in the digital environment, the unique calibration technique allows use of an internal or relative calibration regime to provide a DAC self-calibration methodology that can be used to optimize DAC linearity such that for example 2*¼ scale=½ scale.

Exemplary Circuitry for Calibration

Figure 2:
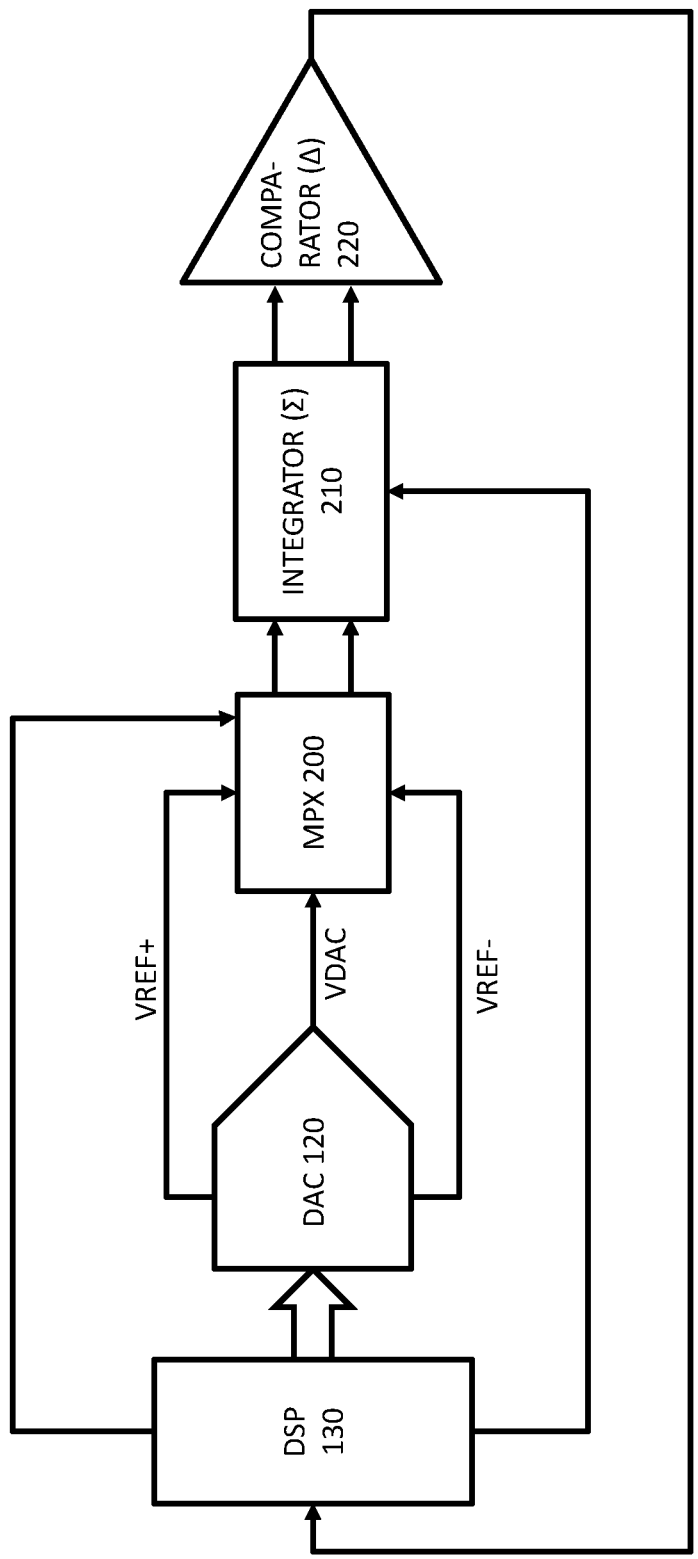
FIG. 2 shows detail of components of the calibration block of FIG. 1, according to some embodiments of the disclosure.

FIG. 2 shows an example of circuitry that can be used as part of the block functionality shown in FIG. 1. The system can include a DSP 130 and DAC 120, and can further include a multiplexer 200, integrator 210, and comparator 220.

In some examples, a differential output is taken from the DAC 120 and provided to a multiplexer 200 which is coupled to an integrator 210. It will be appreciated within the context of the disclosure that the functionality of the integrator is that of summation and therefore the terms "summer" or "integrator" are interchangeable within the disclosure. Within this context, the term "summer" may be considered appropriate for the processing of signals in discrete time intervals whereas "integrator" may be more appropriate for "real-time" or concurrently delivered signals.

It will be further appreciated that the functions of a multiplexer and integrator can be combined into specific functional elements but for the sake of ease of explanation within the disclosure, their function is separated. Similarly, circuit elements that provide combined integrator and comparator functionality could be implemented for the individual blocks that are illustrated herein.

The DSP 130 is digitally coupled to each of the multiplexer 200 and the integrator 210, and can be used to control their functionality. Sequential DAC outputs are integrated or summed using the integrator 210 and their differences are then fed to a comparator 220 which is also digitally coupled to the DSP. The comparator 210 provides a digital output that can be fed back to the DSP 130 and be used to digitally calibrate the target points or the DAC transfer function. The DSP 130 may be configured to store individual ones of the digital feedback signals as data points and to check multiple data points to modify a digital input code provided to the DAC 120.

In this way it is possible to check which DAC input code as provided by the DSP 130 corresponds best to mid-scale performance of the DAC 120. This ideal value can then be used as part of a calibration regime such as that shown in FIG. 3.

Exemplary Calibration Regime

Figure 3:
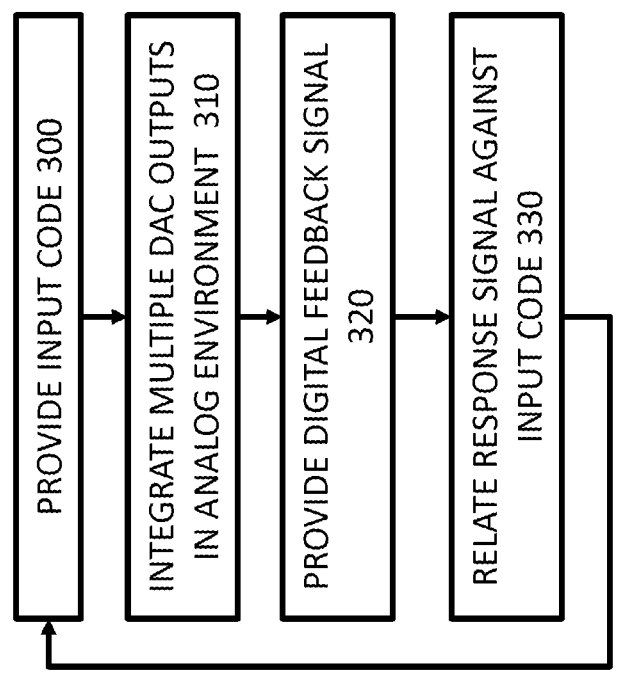
FIG. 3 shows an exemplary methodology, according to some embodiments of the disclosure.

As shown in the methodology of FIG. 3, an input code is provided (300). Multiple outputs from the DAC are then integrated or summed and their difference may be checked by the comparator (310). The checking by the comparator is sometimes referred to as the comparison step. It will be understood that the multiple outputs can be sequential or differential outputs from the same DAC channel or could be different outputs from different DAC channels. This difference between the multiple outputs is then used as a digital feedback signal to the DSP (320). The response characteristics are then related to the input code to provide an internal self-referencing calibration regime where the output from the comparison step in the analog environment is fed back to the input digital side of the architecture and used to compute what values of the input codes are needed for specific output values (330).

Phrased differently, FIG. 3 illustrates a method for self-calibrating a digital-to-analog converter (DAC), the method comprising: providing a digital input code to the DAC (300), integrating multiple DAC outputs in an analog environment (310); providing a digital feedback signal in response to the integration of the multiple DAC outputs (320); and using the feedback signal to calibrate the DAC (330). First and second analog outputs generated by the DAC can be used to provide a feedback signal to the same DAC.

It will be appreciated that any starting regime can be considered. For example, it is possible to use an ideal scenario as a starting point. The DAC output sense point which the comparator senses, via the multiplexer, is important for the precision of such calibration. It will be appreciated that while a one stage multiplexer or switching scheme is shown, there are other more complex multiplexer variations can be used.

Such an ideal scenario is that where twice the mid-scale values is greater than the full scale range of the DAC. If the comparison step does not indicate that this is true then it is possible to increase the DAC input code and repeat the process. As was discussed above the step sizes of the calibration regime can be varied for example through use of a binary search, sub radix-2, single code steps, etc.

Exemplary Additional Processing

Figure 4:
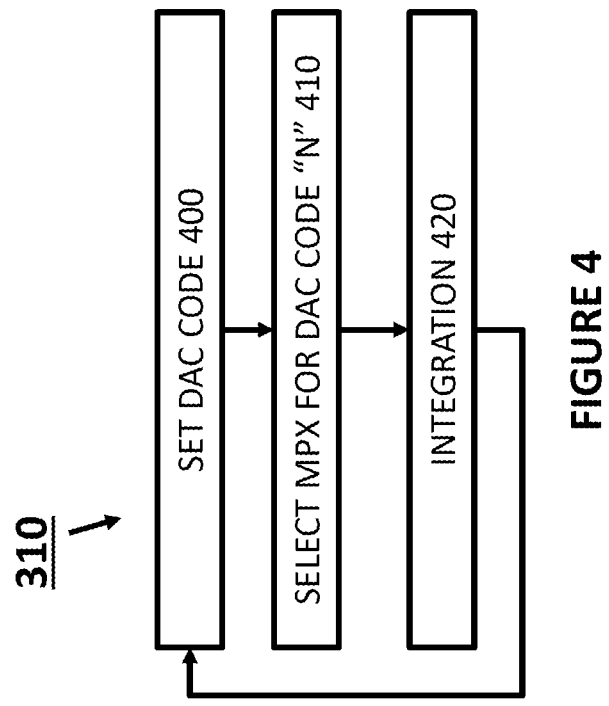
FIG. 4 shows additional steps that may be incorporated within the process flow of FIG. 3, according to some embodiments of the disclosure.

FIG. 4 shows examples of additional processing that may be implemented as part of 310 of FIG. 3. In this example, the DSP sets the DAC (input) code (400). For each DAC code "N", the DSP digitally selects (or controls by providing a selection signal) the multiplexer for that code (410). The DSP also digitally controls the integrator for that code "N", such that the DSP has visibility as to the functionality of the multiplexer and integrator for each code that is input to the DAC. Having integrated the DAC output(s) for a first code (420), the integrator outputs to the comparator which generates a feedback signal (e.g., 320 of FIG. 3). At the same time the integrator can loop back to await a control signal from the DSP for the next DAC code.

Architecture Considerations

A suitable architecture having self-referenced calibration for a DAC is effectively independent of the specifics of the DAC of the architecture. As the circuitry is configured to self-calibrate, the circuitry specifically compensates for the inherent performance characteristics of any one DAC type. It will be appreciated however that, as the architecture is best applied in the context of a DAC that has no significant transfer function gaps arising due to large positive differential non-linearity (DNL), a suitable DAC within the context of the disclosure may have high resolution. One skilled in the art would ordinarily consider 12 bit resolution as being medium resolution such that greater than 12 bit resolution would be considered high resolution. In this context, 16 bit resolution is a popular high resolution DAC as it is provided by 2 bytes of input data.

Figure 5:
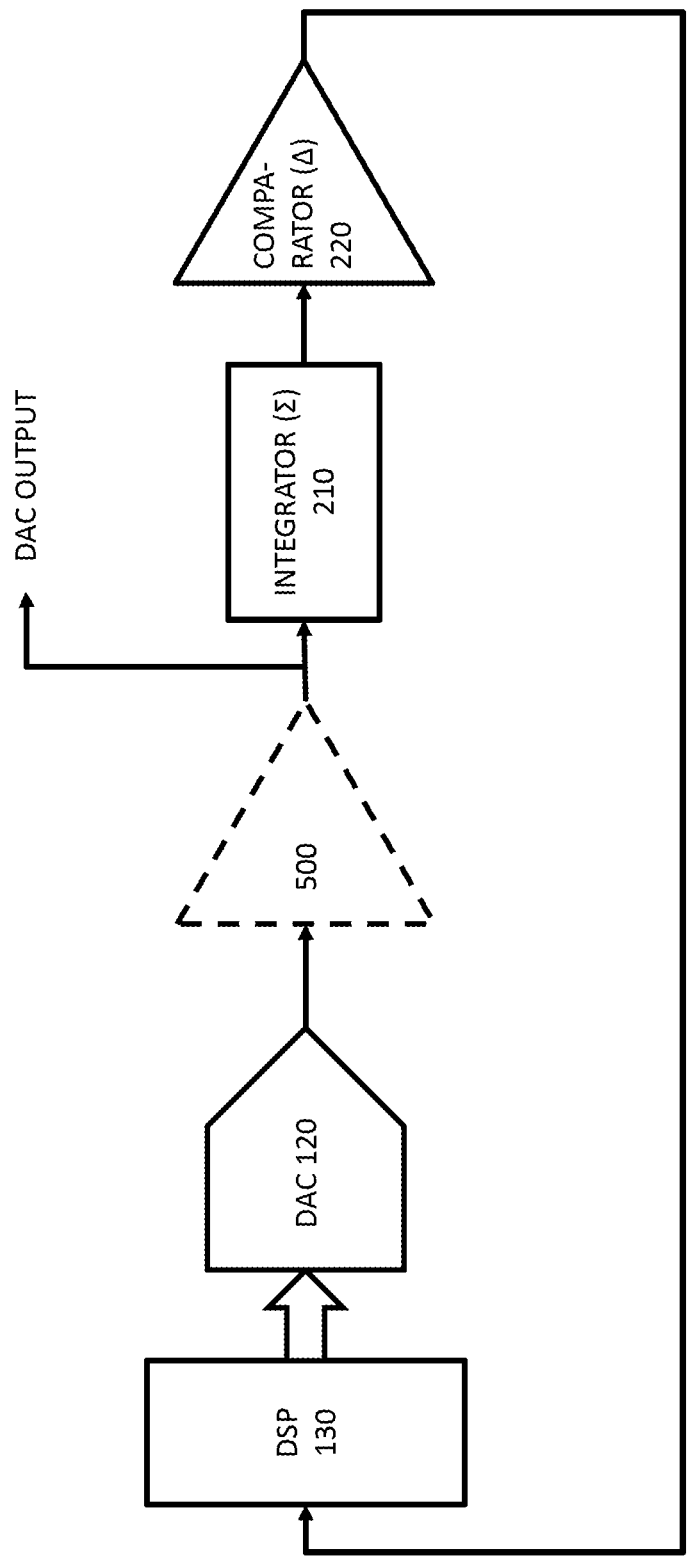
FIG. 5 shows how a buffer may be extended into the architecture of FIG. 2, according to some embodiments of the disclosure.

Other modifications can be made to the circuit architecture. For example, as shown in FIG. 5, a buffer 500 may be optionally be provided between the DAC 120 and the integrator 210. It will be appreciated that the DAC 120 and optional buffer 500 of FIG. 5 can be specific to a given DAC channel but the other functional elements can be multiplexed or shared across a plurality of DAC channels.

The DAC 120 output of the circuit is typically tapped from a node before the integrator 210 such that during normal operation, as opposed to calibration, the DAC output bypasses the additional integrator 210 and comparator 220 functionality.

The specifics of the integrator 210 and comparator 220 can be implemented in accordance with best design practice as will be appreciated by those of skill in the art. For example, the integrator 210 and comparator 220 functionalities can be provided within the context of a successive approximation register (SAR) configuration and similar logic design can be implemented within the context of a circuit provided in accordance with the embodiments disclosed herein. For example, a Johnson counter implementation may be used if the number of states are suitably low. Correlated double sampling (CDS), chopping, and auto-zero techniques could also be used as appropriate.

Exemplary Advantages and Further Considerations

It will be appreciated that as the comparator is providing a self-referencing comparator function, that it does not require external reference sources and can operate around a common mode. For example, it can be provided as a mid-supply common-mode threshold comparator, and this threshold could be set by auto-zeroing the comparator.

An exemplary arrangement of a built-in-self-Test (BIST) and calibration architecture has been described above with reference to using an intrinsic (or 'zero') reference by self-referencing the DAC linearity measurements (e.g., 2*¼ scale=½ scale) such that DAC linearity is functionally tested and/or calibrated with (only) one comparator and using a digital driven architecture to improve precision via digital calibration. Modifications can be made to the exemplary arrangement which has been described herein without departing from the spirit and scope of the disclosure. Architectures described herein exhibit low analog mixed signal (AMS) sensitivity and being digitally-focused architectures are suited to process shrinkage, migration, manufacturing cost reduction, and improving performance.

It will be appreciated that the architecture described herein can use the same DAC to drive the input voltage for both normal signal generation and feedback DAC purposes. Accordingly, the same DAC can used for both signal generation and feedback DAC purposes. By avoiding the need for a separate DAC in the feedback calibration function, the DAC calibration is self-referenced as opposed to requiring secondary elements which can cause problems with performance and precision. The use of first and second signals from the DAC to form the basis of a relative calibration in the analog environment avoids the need for additional external circuitry such as is required in conventional calibration techniques which reference to an external source. It will be appreciated that calibration solutions often use redundant analog mixed signal (AMS) circuitry within sub-blocks of the digital to analog converters and hence the common "calibration DAC" phrase. Such DACs are used to calibrate out both systematic and per device non-idealities versus a reference. In this respect, the embodiments described herein generally does not require additional internal AMS circuitry as well as not requiring additional external circuitry.

Selected Examples

Example 1 is a self-referencing digital-to-analog converter (DAC) architecture comprising: a DAC; a digital signal processor (DSP); an integrator; and a comparator; wherein the integrator is configured to: receive and process first and second outputs from the DAC (in an analog environment); and provide an output signal to the comparator which operably processes the output signal in the analog environment and provides a digital feedback signal to the DSP.

In Example 2, the architecture of Example 1 can optionally include the first and second outputs being time delimited such that the integrator is configured to receive an output at a first time (e.g., T1) and a second output at a second time (e.g., T2). This feature advantageously provides a sequential method (can reduce complexity).

In Example 3, the architecture of Example 1 or 2 can optionally include the first and second outputs being first and second differential outputs from the DAC which are concurrently received and integrated by the integrator.

In Example 4, the architecture of any one of Examples 1-3 can optionally include the comparator being configured to provide a comparison of the integrated differential outputs.

In Example 5, the architecture of any one of Examples 1-4 can optionally include the feedback signal provides an indication of the DAC linearity.

In Example 6, the architecture of any one of Examples 1-5 can optionally include the DSP being configured to: provide a digital input signal to the DAC; and receive the digital feedback signal from the comparator.

In Example 7, the architecture of any one of Examples 1-6 can optionally include the DSP being configured to: check the digital feedback signal against the digital input signal; and modify a second digital input signal based on the check to calibrate a DAC transfer function.

In Example 8, the architecture of any one of Examples 1-7 can optionally include the DSP being configured to: (receive a plurality of digital feedback signals;) store individual ones of the digital feedback signals as data points; and check multiple data points to modify a digital input code provided to the DAC.

In Example 9, the architecture of any one of Examples 1-8 can optionally include the DSP being digitally coupled to the integrator.

In Example 10, the architecture of any one of Examples 1-9 can optionally include the DSP being digitally coupled to a multiplexer, the multiplexer being provided between the DAC and the integrator.

In Example 11, the architecture of any one of Examples 1-10 can optionally include the DSP being configured to control operation of each of the multiplexer and the integrator.

In Example 12, the architecture of any one of Examples 1-11 can optionally include the integrator and comparator being operably decoupled from the DAC subsequent to calibration of the DAC transfer function.

In Example 13, the architecture of any one of Examples 1-12 can optionally include a buffer provided between an output node of the DAC and the integrator.

In Example 14, the architecture of any one of Examples 1-13 can optionally include the calibration being provided without additional internal analog mixed signal circuitry or additional external circuitry to provide a reference for the calibration. This feature provides an advantage of being able to potentially reduce cost and complexity of the system while providing adequate performance of the DAC.

In Example 15, the architecture of any one of Examples 1-14 can optionally include the same DAC being used for both signal generation and feedback DAC purposes. This advantageously reduces components and make use of existing components on chip to provide self-calibration.

In Example 16, the architecture of any one of Examples 1-15 can optionally include the DSP being configured to provide an analysis of the DAC performance based on a plurality of digital feedback signals received from the comparator.

In Example 17, the architecture of any one of Examples 1-16 can optionally include the DSP being configured to compare data points based on the received digital feedback signals against a predetermined range of expected response characteristics.

In Example 18, the architecture of any one of Examples 1-17 can optionally include wherein the predetermined range of expected response characteristics are stored (e.g., in memory).

Example 19 is a method for self-calibrating a digital-to-analog converter (DAC), the method comprising: providing a digital input code to the DAC; integrating multiple DAC outputs in an analog environment; providing a digital feedback signal in response to the integration of the multiple DAC outputs; and using the feedback signal to calibrate the DAC; wherein first and second analog outputs generated by the DAC are used to provide a feedback signal to the same DAC.

In Example 20, the method of Example 19 can optionally include providing a digital signal processor (DSP) configured to provide the digital input code and receive the digital feedback signal.

In Example 21, the method of Example 19 or 20 can optionally include buffering an output signal of the DAC prior to integrating the multiple DAC outputs.

In Example 22, the method of any one of Examples 19-21 can optionally include the multiple DAC outputs comprising first and second outputs which are time delimited such that a first output is provided at a first time (e.g., T1) and a second output at a second time (e.g., T2).

In Example 23, the method of any one of Examples 19-22 can optionally include the multiple DAC outputs being first and second differential outputs from the DAC which are concurrently received and integrated.

In Example 24, the method of any one of Examples 19-23 can optionally include providing a comparator to provide the digital feedback signal in response to the integration of the multiple DAC outputs.

In Example 25, the method of any one of Examples 19-24 can optionally include the feedback signal being provided in the absence of additional analog mixed signal internal circuitry or additional external circuitry.

Any one of the above mentioned Examples 19-25 can include features described in realizing the architecture mentioned in any one or more Examples 1-18.

Example A includes one or more machine-readable media including code that, when executed, causes a digital signal processor to provide the described self-calibration functionalities (e.g., including control of the integrator and comparator, processing the feedback signals, etc.)

Example B is an apparatus comprising means for performing the method of any one of Examples 1-18.

Exemplary Applications and Variations

Such systems, apparatus, and/or methods can be implemented in various electronic devices. Examples of the electronic devices can include, but are not limited to, consumer electronic products, parts of the consumer electronic products, electronic test equipment, wireless communications infrastructure, industrial control, and control circuitry generally and other application as will be appreciated by those of ordinary skill. Examples of the electronic devices can also include circuits of optical networks or other communication networks, and driver circuits. In certain contexts, the features discussed herein can be applicable to medical systems, scientific instrumentation, wireless and wired communications, radar, industrial process control, audio and video equipment, current sensing, instrumentation, and other digital-processing-based systems. Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc. In yet other example scenarios, the teachings of the disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc. The consumer electronic products can include, but are not limited to, measurement instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator (or other household appliances), a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a scanner, a multi-functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings of the inventions provided herein can be applied to other systems, not necessarily the circuits described above. The elements and acts of the various embodiments described above can be combined to provide further embodiments. The act of the methods discussed herein can be performed in any order as appropriate. Moreover, the acts of the methods discussed herein can be performed serially or in parallel, as appropriate.

In the discussions of the embodiments above, any of the electronic components such as integrators and comparators can readily be replaced, substituted, or otherwise modified in order to accommodate particular circuitry needs. Moreover, it should be noted that the use of complementary electronic devices, hardware, software (if applicable), etc. offer an equally viable option for implementing the teachings of the disclosure.

Parts of various apparatuses for providing self-calibration of a DAC can include electronic circuitry to perform the functions described herein. In some cases, one or more parts of the apparatus, e.g., the DSP, can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the disclosure may be readily included in a system on chip (SOC) package, either in part, or in whole. An SOC represents an IC that integrates components of a computer or other electronic system into a single chip. It may include digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the self-calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the disclosure, but may or may not necessarily be combined in the same embodiments.

It is also important to note that the functions related to self-calibration of a DAC, illustrate only some of the possible functions that may be executed by, or within, systems illustrated in the FIGURES. Some of these operations may be deleted or removed where appropriate, or these operations may be modified or changed considerably without departing from the scope of the disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the disclosure.

Numerous other changes, substitutions, variations, alterations, and modifications may be ascertained to one skilled in the art and it is intended that the disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A self-referencing digital-to-analog converter (DAC) system comprising:
    a DAC;
    digital signal processing circuitry;
    an integrator; and
    a comparator;
    wherein the integrator:
        receives and processes first and second outputs from the DAC; and
        provides an output signal to the comparator which operably processes the first and second outputs in the analog environment and provides a digital feedback signal to the digital signal processing circuitry.

2. The system of claim 1, wherein the first and second outputs are time delimited such that the integrator is configured to receive an output at a first time and a second output at a second time.

3. The system of claim 1, wherein the first and second outputs are first and second differential outputs from the DAC which are concurrently received and integrated by the integrator.

4. The system of claim 1, wherein:
    the DAC has multiple DAC channels; and
    the first and second outputs comprise different outputs from the multiple DAC channels.

5. The system of claim 1 wherein the feedback signal provides an indication of the DAC linearity.

6. The system of claim 1, wherein the digital signal processing circuitry:
    provides a digital input signal to the DAC; and
    receives the digital feedback signal from the comparator.

7. The system of claim 6, wherein the digital signal processing circuitry:
    checks the digital feedback signal against the digital input signal; and
    modifies a second digital input signal based on the check to calibrate a DAC transfer function.

8. The system of claim 7, wherein the integrator and comparator are operably decoupled from the DAC subsequent to calibration of the DAC transfer function.

9. The system of claim 6, wherein the digital signal processing circuitry analyzes the DAC performance based on a plurality of digital feedback signals received from the comparator.

10. The system of claim 9, wherein the digital signal processing circuitry compares data points based on the received digital feedback signals against a predetermined range of expected response characteristics.

11. The system of claim 1, wherein the digital signal processing circuitry:
    receives a plurality of digital feedback signals;
    stores individual ones of the digital feedback signals as data points; and
    checks multiple data points to modify a digital input code provided to the DAC.

12. The system of claim 1, wherein the digital signal processing circuitry is digitally coupled to the integrator.

13. The system of claim 1, further comprising a buffer provided between an output node of the DAC and the integrator.

14. The system of claim 1, wherein the system does not include additional internal analog mixed signal circuitry or additional external circuitry to provide a reference for calibrating the DAC.

15. The system of claim 1, wherein the same DAC is used for both signal generation and feedback DAC purposes.

16. The system of claim 1, wherein the digital signal processing circuitry is digitally coupled to a multiplexer, the multiplexer being provided between the DAC and the integrator.

17. A method for self-calibrating digital to analog conversion circuitry, the method comprising:
    providing input codes to convert the input codes to convert the input codes into multiple analog outputs;
    integrating the multiple analog outputs in an analog environment;
    receiving digital feedback signals based on the integration of the multiple analog outputs; and
    determining further input codes corresponding to specific output values based on the digital feedback signals.

18. The method of claim 17, further comprises:
    identifying errors in response characteristics of the digital to analog conversion circuitry based on the digital feedback signals.

19. A method for self-calibrating a digital-to-analog converter (DAC), the method comprising:
    providing, by digital signal processing circuitry, input codes to the DAC;

integrating, by an integrator, multiple DAC outputs in an analog environment;
providing, by a comparator, digital feedback signals to the digital signal processing circuitry in response to the integration of the multiple DAC outputs; and
calibrating the DAC using the digital feedback signals.

20. The method of claim 19, further comprising:
analyzing performance of the DAC by comparing data points based on the digital feedback signals against a predetermined range of expected response characteristics.

* * * * *